(12) United States Patent
Kingon et al.

(10) Patent No.: US 6,541,137 B1
(45) Date of Patent: Apr. 1, 2003

(54) MULTI-LAYER CONDUCTOR-DIELECTRIC OXIDE STRUCTURE

(75) Inventors: Angus Kingon, Cary, NC (US); Gregory J. Dunn, Arlington Heights, IL (US); Stephen Streiffer, Oak Park, IL (US); Kevin Cheek, Raleigh, NC (US); Min-Xian Zhang, Algonquin, IL (US); Jon-Paul Maria, Raleigh, NC (US); Jovica Savic, Downers Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 18 days.

(21) Appl. No.: 09/629,504

(22) Filed: Jul. 31, 2000

(51) Int. Cl.[7] .................................................. B32B 9/00
(52) U.S. Cl. ...................... 428/701; 428/702; 428/699; 338/226
(58) Field of Search ................................ 428/688, 689, 428/699, 701; 338/226; 361/268

(56) References Cited

U.S. PATENT DOCUMENTS 6,194,990 B1 * 2/2001 Lee et al. .................... 338/320
6,207,522 B1   3/2001 Hunt et al.

FOREIGN PATENT DOCUMENTS

WO      WO01/67465 A2    9/2001

* cited by examiner

Primary Examiner—Deborah Jones
Assistant Examiner—Arden B. Sperty
(74) Attorney, Agent, or Firm—Daniel K. Nichols

(57) ABSTRACT

A dielectric film is formed on a free-standing conductive metal layer to form a multi-layer foil comprising a conductive metal layer, a barrier layer and a dielectric oxide layer. Such multi-layer foils are mechanically flexible, and useful for the manufacture of capacitors. Examples of barrier layers include Ni—P or Ni—Cr alloys. After a second layer of conductive metal is deposited on a dielectric oxide surface opposing the first conductive metal layer, the resulting capacitor foil is processed into a capacitor. The resulting capacitor is a surface mounted capacitor or is formed as a integrated or embedded capacitor within a circuit board.

19 Claims, 4 Drawing Sheets

MULTI-LAYER CONDUCTOR-DIELECTRIC OXIDE STRUCTURE

This invention was made with support from the United States Government under Agreement No. F33615-96-2-1838, awarded by DARPA. The United States Government has certain rights in this invention.

BACKGROUND

The present invention generally relates to multi-layer conductor-dielectric oxide foils suitable for making capacitors that are integrated or embedded in circuit boards.

In the electronics art, smaller often means better. In the quest to provide smaller electronic appliances, the electronics industry seeks electronic components that are smaller than predecessor components.

The capacitor (a dielectric material sandwiched between two conductors) represents one electronic component that has substantially shrunk in this quest. However, current practice relies on individually mounting and soldering each capacitor onto the surface of circuit boards. Despite the advances in capacitor miniaturization, each surface mounted capacitor still occupies a significant fraction of the circuit board surface area, and requires substantial cost to "pick and place" onto the board. For example, a typical cellular phone contains over 200 surface mounted capacitors connected to circuit boards by over 400 solder joints. The ability to integrate or embed capacitors in circuit boards during manufacture of the circuit boards would provide substantial space and cost savings over surface mounted capacitors. Unfortunately, efforts to make capacitors that can be integrated or embedded into circuit boards have produced capacitors that do not have sufficient capacitance (e.g. <10 $pF/mm^2$) to replace many of the capacitors (e.g., requiring >100 pF capacitance) on a circuit board.

Printed circuit boards typically comprise multiple layers of copper and glass-reinforced epoxy or other polymer. The copper is patterned to form the conducting elements of the circuit, and the polymer provides dielectric isolation and mechanical robustness. Polymers are low dielectric constant materials, and therefore parallel plate embedded capacitors formed within the polymer dielectric circuit board do not offer high capacitance density.

Although ceramic dielectrics that have very high dielectric constants are available, they are typically too rigid to be mechanically compatible with organic printed circuit boards. Further, organic printed circuit boards are incompatible with the methods used to form the ceramic dielectric films. Ceramic dielectric films are commonly formed by a broad range of deposition techniques, such as chemical solution deposition (CSD), evaporation, sputtering, physical vapor deposition and chemical vapor deposition. However, in order to achieve the requisite dielectric structure, each technique typically requires either a high-temperature deposition or a high-temperature anneal. Such temperatures would melt, ignite or otherwise degrade the organic materials in the circuit board substrate.

Furthermore, these processes are incompatible with copper in two ways. First, at the high temperatures and oxidizing conditions needed to form the ceramic dielectric, copper forms a thin layer of copper oxide at the interface between the ceramic dielectric and the copper. This effectively forms an interface layer which will degrade the overall device performance, thus negating any advantage gained by the use of the ceramic dielectric. Second, the reducing atmosphere favored by copper produces excessive defect concentrations and may frustrate phase formation in the dielectric oxide layer. Efforts to form ceramic films at temperatures that are compatible with circuit board components have generally compromised the dielectric properties of the resulting ceramic. For ceramic dielectrics, it is apparent that favorable dielectric properties are intimately linked to a complex crystal structure (i.e., perovskite) that is difficult to develop at lower temperatures.

Dielectric oxides such as lead zirconate titanate (PZT) and lead lanthanum zirconate titanate (PLZT) belong to a particularly promising class of high permittivity ceramic dielectrics with the perovskite crystal structure. When formed by the CSD process, dielectric oxides can be made into very thin, flexible, robust layers with very high dielectric constants.

It has been proposed that dielectric oxides such as PZT and PLZT can be formed on a free-standing metal foil, then incorporated into the circuit board. However, as discussed above, prior efforts to do so on less expensive metals such as copper were frustrated by the incompatibility of copper with the temperature required to form the requisite dielectric structure. Currently, such dielectric oxides are formed by depositing a solution of dielectric oxide starting material on a film of a noble metal, such as platinum. In turn, the noble metal film rests on a silicon or ceramic substrate that is very smooth and can withstand high processing temperatures (about 400 to about 800° C.). The solution is heated to remove the solvent. This leaves a dielectric oxide starting material residue, which is then sintered to form a thin dielectric oxide layer on the noble metal film. Thereafter, another conductor layer is disposed on the opposing, exposed surface of the dielectric oxide layer to form a capacitor. However, it is apparent that noble metals cost too much to compete with copper as the principal conductor in printed circuit boards.

The present invention overcomes the incompatibility of the polymer with high-temperature processes by forming the dielectric oxide film on a metal foil before attaching the foil to a circuit board substrate. In this way, the circuit board polymer is not exposed to the high processing temperatures required to form a high permittivity dielectric oxide film. Moreover, the present invention provides a way to use a less expensive metal such as copper as the base metal.

DETAILED DESCRIPTION

Figure 1:
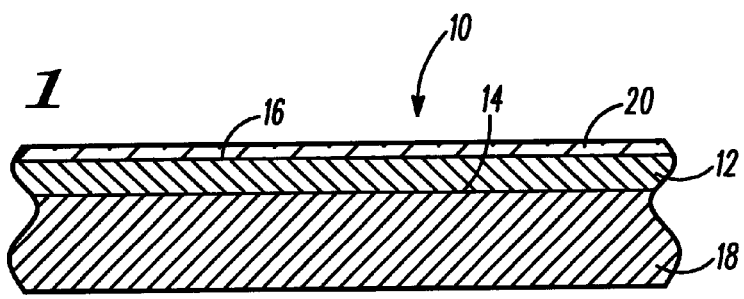
FIGS. 1 and 2 illustrate sectional views of multi-layer foils according to the present invention.

As shown in FIG. 1, the present invention is directed to a multi-layer foil 10 formed by disposing a barrier layer 12 on a first conductive metal surface 14 of a conductive metal layer 18. A dielectric oxide layer 20 is then deposited on a barrier surface 16, wherein barrier layer 12 inhibits oxidation of the conductor metal layer during deposition of the dielectric oxide layer.

The barrier layer is deposited on the conductive metal foil by sputtering, electroless plating or electrolytic plating metals selected from palladium, platinum, iridium, nickel-phosphorus nickel-chromium or nickel-chromium with a minor amount of aluminum. More specific examples of barrier metals include electroless or electrolytic nickel phosphorus. The phosphorous content of the nickel-phosphorous generally range from about 1 to about 40 wt % phosphorous, more specifically about 4–11 wt % and even more specifically about 7–9 wt %.

Specific examples of dielectric oxide according to this invention include (PZT), (PLZT), lead lanthanide titanate (PLT), lead titanate (PT), lead zirconate (PZ), lead magnesium niobate (PMN), barium titanate (BTO) and barium strontium titanate (BSTO). Dielectric oxides comprising the PLZT system, particularly compositions comprising the PLZT formula $(Pb_{1-x}La_x)(Zr_{0.52}Ti_{0.48})O_3$, where X is about 0.15 are particularly attractive. Adding La to PZT is well-known for the ability of La to achieve optimal performance by modifing the electrical properties of the dielectric. Similarly, addition of small quantities of other elements such as Ni, Nb, Ca and Sr can also improve electrical performance. Accordingly, the dielectric oxides according to the invention may also contain small quantities of Ni, Nb, Ca and Sr.

The conductive metal layer comprises a metal selected from the group consisting of copper, copper alloy, nickel and nickel alloy. More specific examples, include those containing copper.

One specific embodiment of the multi-layer foil utilizes a nickel alloy having a concentration of alloy ingredient effective to limit oxidation of the conductive metal layer. Nickel phosphorus having a phosphorus concentration of about 1 to about 40 wt %, more specifically about 4–11 wt %, even more specifically about 7–9 wt % provide a particularly effective barrier. While not limited to any theory, it is believed that, during processing, nickel phosphorus precipitates as nickel phosphide to form a physical barrier at the grain boundaries of the metal. Alternatively, it is believed that an ingredient in the nickel phosphorus alloy acts as an oxygen scavenger to limit oxidation of the conductor metal. In any case, nickel phosphorus provides a particularly effective barrier.

More specific examples of barriers include about 1–5 microns nickel phosphorus having about 4–11 wt % phosphorus concentration or about 0.1–0.2 micron iridium. Specific examples of conductive metal include about 20–50 microns of copper, copper alloy, nickel or nickel alloy. The dielectric oxide is selected from about 0.1 to about 1 micron, more specifically 0.2–0.4 micron PLZT or PZT.

Alternatively, a Cu/NiP foil such as that sold under the name Ohmega-Ply by Ohmega Technologies can be used as the conductive metal layer and barrier layer according to the invention. As will be discussed below, it is desirable for the barrier layer to have a sheet resistance between about 5 and about 100 ohms/square.

Figure 2:
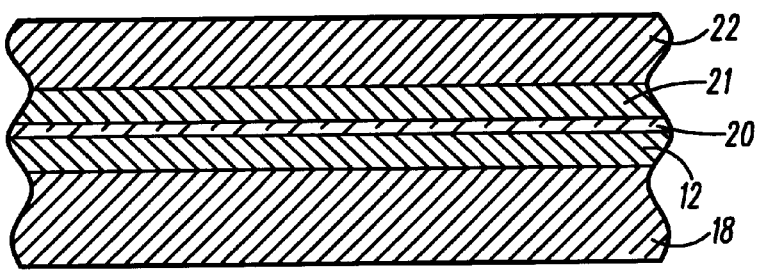

Although multi-layer foil 10 can be made into a capacitor by a variety of processes, at least one more conductive metal layer must be disposed on multi-layer foil 10 in each process. Accordingly, a further embodiment of the present invention is directed to a capacitor foil having a second conductive metal layer disposed on the exposed side of the dielectric oxide surface of the multi-layer foil described above. FIG. 2 illustrates this embodiment as further modified by a second barrier layer 21 interposed between the second conductive metal layer 22 and the dielectric oxide layer 20. However, it is apparent that the second conductive metal layer 22 can be deposited directly on the dielectric layer 20.

The second barrier is selected from metals such as those described for the barrier layer. The second conductive metal layer is selected from nickel, nickel alloy, copper, copper alloy, platinum or palladium. The second barrier layer is deposited on the dielectric oxide layer by evaporation, sputtering, plasma chemical vapor deposition or vacuum plating. The second conductive layers may be deposited by the same methods, or by electroless or electrolytic plating. The second conductive layer and optionally the second barrier layer can be disposed on the multi-layer foil before or after lamination on a circuit board substrate.

Figure 3:
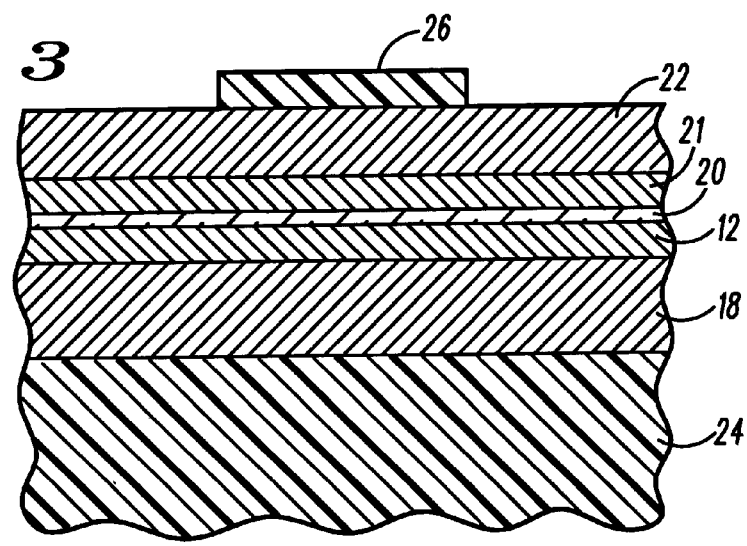
FIGS. 3–6 illustrate sectional views of steps by which the multi-layer foil is formed into a capacitor.
Figure 4:
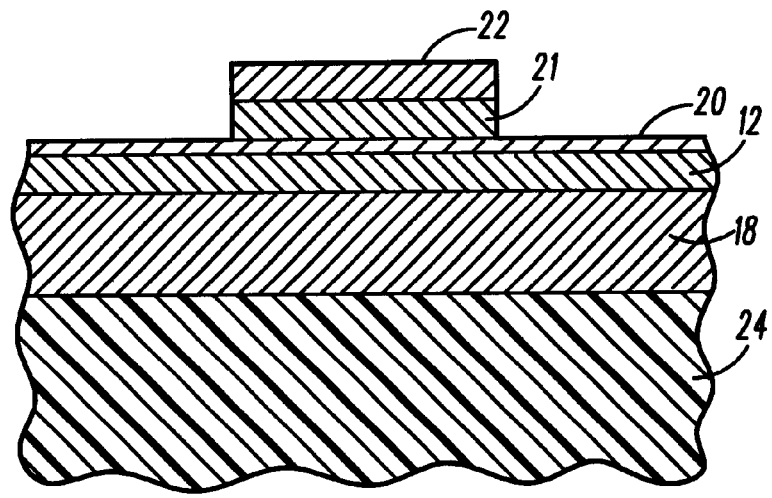

As shown in FIG. 3, the capacitor foil can be processed into a capacitor by laminating the capacitor foil onto a circuit board substrate 24. Etch-resist 26 is applied and subsequently patterned on the exposed surface of an exposed conductive metal layer. In FIG. 4, the exposed conductive metal layer not covered by the etch-resist is etched away and the etch resist is removed.

Figure 5:
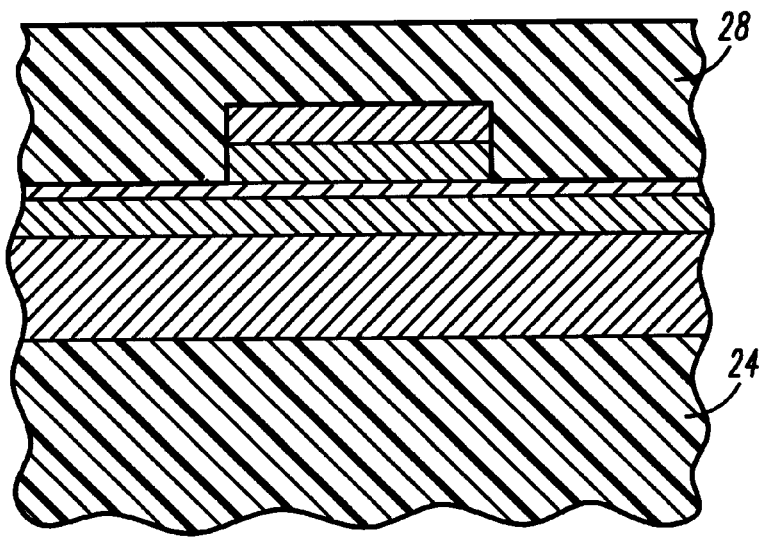
Figure 6:
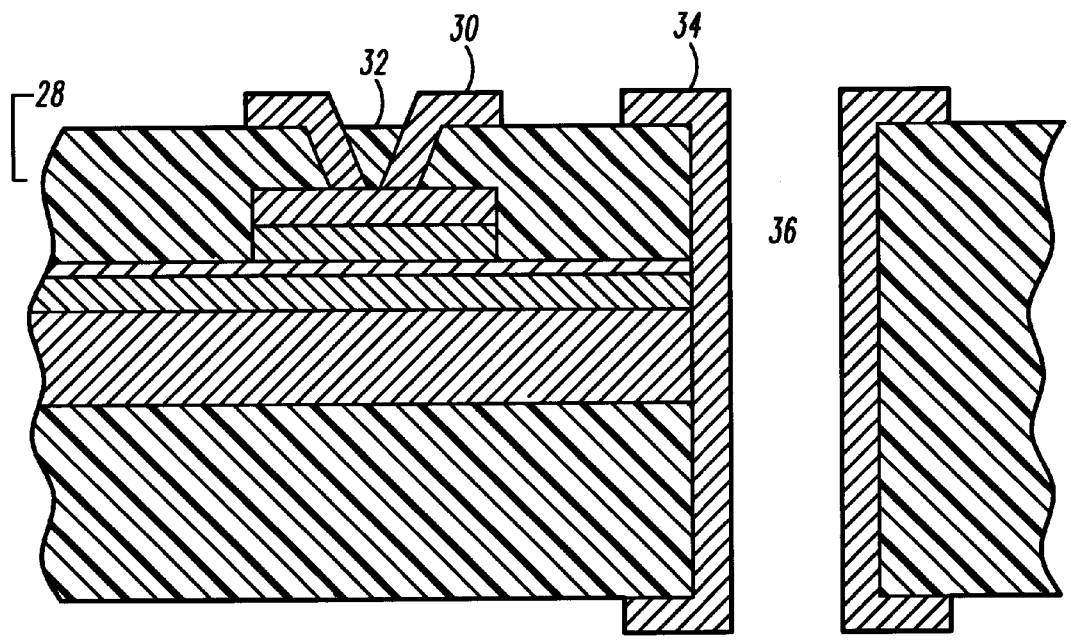

In FIG. 5, a polymer 28 is deposited over the exposed surface of the capacitor foil. In FIG. 6, the remaining second conductive metal layer is connected to a first terminal 30 formed at a first opening in polymer 28. FIG. 6 also illustrates a second terminal 34 formed at a second opening 36 connected to the first conductive metal layer, thus forming a capacitor that is embedded within a circuit board.

Figure 7:
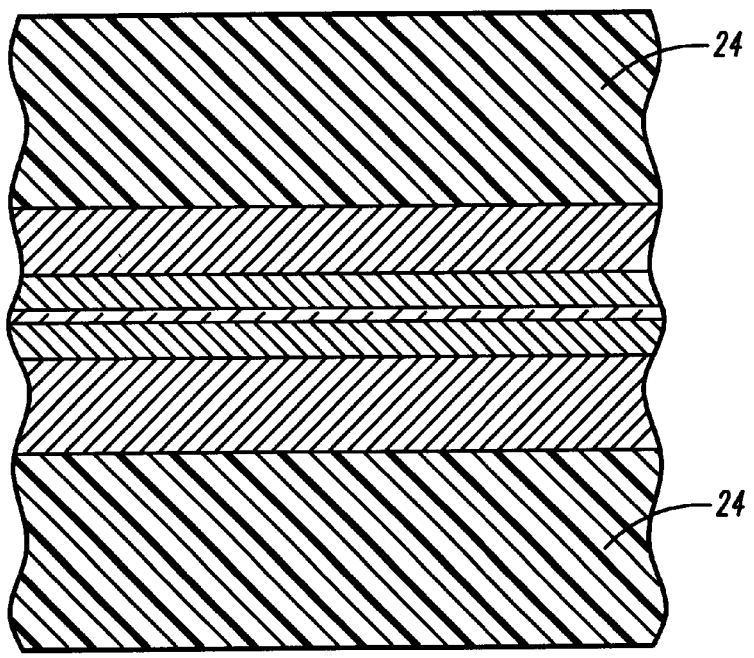
FIG. 7 illustrates the sectional view of one embodiment in which the multi-layer foil is embedded in a circuit board substrate.

FIG. 7 illustrates an example in which the capacitor foil is sandwiched between two circuit board substrates 24. The circuit board having the embedded capacitor foil is then processed by known methods into circuit boards having embedded capacitors.

Figure 8:
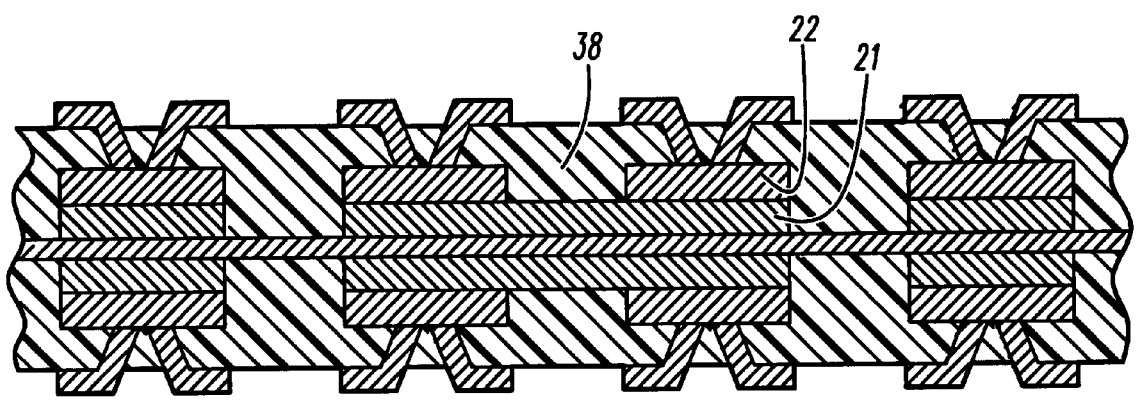
FIG. 8 illustrates the sectional view of an embedded resistor-capacitor circuit.

The capacitor foil described above can also form integral resistor/capacitor circuits. The resistors are formed of nickel-phosphorus or nickel-chromium. FIG. 8 illustrates a resistor-capacitor circuit embedded in a circuit board, wherein a barrier layer and the overlying conductor layer are etched by known methods to define capacitors and a resistor 38 that connects two of the capacitors. Resistive (25–250 ohm/square) layers of about 400 to about 4000 angstrom nickel phosphorus and 300 angstrom nickel chromium on copper foil are commercially available from Ohmega Technologies and RCfoil respectively. Optionally, the integrated structures may also include inductors alone, or in combination with the capacitors and/or resistors described above (not shown).

While the present invention has been described in terms of particular embodiments, it is apparent that one skilled in the art can adopt other forms without departing from the scope and spirit of this invention. Accordingly, the scope of the invention is limited only by the literal and equivalent scope of the claims that follow. In addition, any art cited herein is incorporated by reference.

EXAMPLE

A sheet of 50 micron Cu foil was coated with 4 micron electroless Ni—P from a $NiCl_2$—$Na(H_2PO_2)$ solution bath. Methanol-based lead acetate trihydrate, titanium isopropoxide, lanthanum isopropoxide and zirconium N-butoxide were applied to the foil by spin-on deposition. The film was dried at 250° C. for 5 minutes, then pyrolyzed in air at 450° C. for 10 minutes. The procedure was repeated 6 times to achieve the desired thickness (about 6000 angstroms). Then, the film was crystallized in nitrogen at 600° C. for 30 minutes. Capacitor structures were completed by ion beam deposition of Cu, Pt or Ni top electrodes.

Flexibility of the foil was tested. It was determined that the foils could be repeatedly bent around 1" mandrels without incurring mechanical damage.

Embedded capacitors were made by the following process:
1. laminate foil to FR4 circuit board substrate;
2. resin cure;
3. surface pickle of Cu top electrode;
4. Cu electroplate to about 50 micron thickness;
5. apply and UV image etch resist;
6. etch with $CuCl_2$ acid spray to remove unwanted Cu top electrode;
7. strip remaining etch resist;
8. coat epoxy resin;
9. UV expose and pattern vias;
10. drill through-holes;
11. electroless Cu blanket coat;
12. electroplate;
13. apply and image etch resist; and
14. etch with $CuCl_2$ acid spray to remove unwanted Cu.

An embedded capacitor according to the invention was made and tested. The 1.7 mm by 1.7 mm capacitor had a capacitance of 7 nF.

We claim:

1. A multi-layer foil comprising:
    a conductive metal layer having opposing first and second metal surfaces;
    a barrier layer disposed on the first metal surface and having a barrier surface;
    and a dielectric oxide layer disposed on the barrier surface,
    wherein the barrier layer is formed from a nickel alloy containing a concentration of an alloy ingredient effective to limit oxidation of the conductive metal layer.

2. The multi-layer foil of claim 1, wherein the conductive metal comprises a metal selected from group consisting of copper, copper alloys, nickel and nickel alloys.

3. The multi-layer foil of claim 2, wherein the dielectric oxide is a lead containing dielectric oxide.

4. The multi-layer foil of claim 2, wherein the dielectric oxide is formed from a material selected from the group consisting of lead zirconate titanate, lead lanthanum zirconate titanate, lead lanthanide titanate, lead titanate, lead zirconate, lead magnesium niobate, barium titanate, and barium strontium titanate, the dielectric oxide further comprising optional additional small quantities of nickel, niobium, calcium or strontium.

5. The multi-layer foil of claim 4, wherein the dielectric oxide is formed from a material selected from the group consisting of lead zirconate titanate and lead lanthanum zirconate titanate.

6. The multi-layer foil of claim 5, wherein a second conductive metal layer is disposed on a surface of the dielectric oxide layer.

7. The multi-layer foil of claim 1, wherein a layer of palladium or platinum is interposed between the barrier layer and the dielectric oxide layer.

8. The multi-layer foil of claim 1, wherein the barrier layer is a nickel phosphorus comprising about 1 to about 40 wt % phosphorous.

9. The multi-layer foil of claim 1, wherein the barrier layer is a nickel phosphorus comprising about 4 to about 11 wt % phosphorous.

10. The multi-layer foil of claim 1, wherein the barrier layer is a nickel phosphorus comprising about 7 to about 9 wt % phosphorous.

11. A multi-layer foil comprising:
    a copper layer of about 10 to about 50 micron thickness having opposing first and second copper surfaces;
    a barrier layer composing about 1 to about 3 micron thickness nickel phosphorus disposed on the first copper surface, and having a barrier surface, wherein the phosphorus concentration of the nickel phosphorus layer is about 4 to about 11 wt %;
    and a dielectric oxide layer comprising lead of about 0.2 to about 1 micron thickness disposed on the barrier surface.

12. The multi-layer foil of claim 11, wherein the dielectric oxide is form from a material selected from lead zirconate titanate or lead lanthanum zirconate titanate.

13. A capacitor foil comprising:
    the multi-layer foil of claim 11;
    wherein the dielectric oxide layer has a dielectric oxide surface;
    and a second conductive metal layer is disposed on the dielectric oxide surface.

14. The capacitor foil of claim 13 further comprising a second barrier layer interposed between the second conductive metal layer and the dielectric oxide layer.

15. The capacitor foil of claim 13, wherein the dielectric oxide is formed from a material selected from the group consisting of lead zirconate titanate, lead lanthanum zirconate titanate, lead lanthanide titanate, lead titanate, lead zirconate, lead magnesium niobate, barium titanate, and barium strontium titanate, the dielectric oxide further comprising optional additional small quantities of nickel, niobium, calcium or strontium.

16. The capacitor foil of claim 13, wherein the second conductive metal layer comprise a metal selected from the group consisting of copper, copper alloys, nickel, nickel alloys, palladium and platinum.

17. The capacitor foil of claim 14, wherein the second barrier layer comprises nickel-phosphorus.

18. A capacitor containing circuit board comprising:
    circuit board substrate having a substrate surface;
    and a capacitor comprising a first electrode comprising a first conductive metal layer having a first conductive metal surface and a barrier layer consisting of nickel phosphorus having a barrier surface;
    a dielectric oxide layer deposited on the barrier surface having an opposing dielectric oxide surface;
    and a second electrode disposed on the dielectric oxide surface having an opposing second electrode surface,
    wherein the capacitor is disposed on the substrate surface by either the first conductive metal surface or the second electrode surface and the opposing electrode defines a capacitor,
    and wherein the barrier layer inhibits oxidation of the conductor metal layer during deposition of the dielectric oxide layer.

19. The capacitor according to claim 18, wherein the second electrode comprises a second conductive metal layer and a second barrier layer consisting of nickel phosphorus interposed between the second conductive metal layer and the dielectric oxide layer.

* * * * *

UNITED STATES PATENT AND TRADEMARK OFFICE
CERTIFICATE OF CORRECTION

PATENT NO. : 6,541,137 B1
DATED : April 1, 2003
INVENTOR(S) : Kingon et al.

It is certified that error appears in the above-identified patent and that said Letters Patent is hereby corrected as shown below:

<u>Title page,</u>
Item [73], should read:
-- [73] Assignee: Motorola, Inc., Schaumburg, IL (US)
                       North Carolina State University, Raleigh, NC (US) --.

Signed and Sealed this

Fifteenth Day of November, 2005

JON W. DUDAS
*Director of the United States Patent and Trademark Office*